United States Patent
Wang et al.

(10) Patent No.: US 11,856,715 B2
(45) Date of Patent: Dec. 26, 2023

(54) SPLICING ASSEMBLY AND SPLICING DISPLAY SCREEN

(71) Applicant: TCL CHINA STAR OPTOELECTRONICS TECHNOLOGY CO., LTD., Guangdong (CN)

(72) Inventors: Min Wang, Guangdong (CN); Yao Chen, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 92 days.

(21) Appl. No.: 17/597,233

(22) PCT Filed: Dec. 16, 2021

(86) PCT No.: PCT/CN2021/138901
§ 371 (c)(1),
(2) Date: Dec. 29, 2021

(87) PCT Pub. No.: WO2023/103019
PCT Pub. Date: Jun. 15, 2023

(65) Prior Publication Data
US 2023/0189454 A1    Jun. 15, 2023

(30) Foreign Application Priority Data
Dec. 9, 2021   (CN) .......................... 202111501185.0

(51) Int. Cl.
*H05K 5/00* (2006.01)
*F16B 5/00* (2006.01)

(52) U.S. Cl.
CPC ......... *H05K 5/0021* (2013.01); *F16B 5/0012* (2013.01)

(58) Field of Classification Search
CPC ... H05K 5/0021; H05K 5/0017; H05K 5/0217
USPC ....................................................... 361/730
See application file for complete search history.

(56) References Cited

U.S. PATENT DOCUMENTS

| 7,839,655 | B2 * | 11/2010 | Clark | ................. H01R 13/5045 361/752 |
| 11,083,099 | B2 * | 8/2021 | Madsen | ............. H01R 12/7011 |
| 2013/0119216 | A1 | 5/2013 | Kuo et al. | |
| 2017/0166135 | A1 * | 6/2017 | Baskin | ................... B60R 3/002 |

FOREIGN PATENT DOCUMENTS

| CN | 107734732 A | 2/2018 |
| CN | 209447445 U | 9/2019 |
| CN | 210006402 U | 1/2020 |

(Continued)

*Primary Examiner* — Hung S. Bui
(74) *Attorney, Agent, or Firm* — Hamre, Schumann, Mueller & Larson, P.C.

(57) ABSTRACT

The embodiment of the application discloses a splicing assembly and a splicing display screen. The splicing assembly includes a first connecting member, a second connecting member, and a locking member. The first connecting member has a plug-in portion. The second connecting member has a coupling portion for mating with the plug-in portion. The locking member is used for locking the first connecting member and the second connecting member together.

18 Claims, 6 Drawing Sheets

(56) References Cited

FOREIGN PATENT DOCUMENTS

| CN | 210739028 U | | 6/2020 | |
|---|---|---|---|---|
| CN | 210777622 U | | 6/2020 | |
| CN | 111851891 | * | 10/2020 | ............. E04F 1/072 |
| CN | 211906125 U | | 11/2020 | |
| CN | 112796480 A | | 5/2021 | |
| CN | 213519077 U | | 6/2021 | |
| CN | 113314038 | * | 8/2021 | ............. G09F 9/302 |
| CN | 113744663 A | | 12/2021 | |
| CN | 217420703 | * | 9/2022 | ............... E04H 6/42 |

* cited by examiner

SPLICING ASSEMBLY AND SPLICING DISPLAY SCREEN

FIELD OF INVENTION

The present disclosure relates to a field of display, in particular to a splicing assembly and a splicing display screen.

BACKGROUND OF INVENTION

As display technology is continuously developing, applications of display become more and more extensive. Not only for televisions, monitors, industrial displays, and medical displays, but also for more and more public display occasions. In public display applications, the display generally needs to have a greater display area to meet requirements of people watching from a long-distance and displaying a larger amount of information. However, in the current development status of liquid crystal display (abbreviated to LCD), conventional size is 32 inches to 55 inches. If the display in this size range is used for public display, a multi-screen splicing method is required.

When multiple screens are spliced, the original frame of each display borders each other to form a splicing seam, which is obviously seen. Various panel manufacturers in the industry have begun to overcome related technical problems and reduce the physical frame of the display in order to continuously reduce the seam. At present, the mainstream seams in the industry are between 3.5 mm and 5.5 mm. Some high-end products or technology exhibition have even reached to 1.4 mm.

Splicing screens usually transport multiple screens to the site, and then assemble and splice multiple screens in sequence. Two adjacent screens are easily misaligned, resulting in a decrease in splicing accuracy. In order to ensure splicing accuracy, workers need to repeatedly confirm the position of the screens, which will undoubtedly increase the complexity of the installation steps, resulting in low installation efficiency.

Technical Problems

The embodiments of the present disclosure provide a splicing assembly and a splicing display screen, which can solve the technical problems of the existing splicing screens that it is difficult to ensure the splicing accuracy, the installation steps are complicated, and the efficiency is low.

SUMMARY OF INVENTION

Technical Solutions

An embodiment of the present disclosure provides a splicing assembly, comprising:
a first connecting member comprising a plug-in portion,
a second connecting member comprising a coupling portion for mating with the plug-in portion, and
a locking member for locking the first connecting member and the second connecting member together when the first connecting member is inserted into the second connecting member, and
wherein when the first connecting member is inserted into the second connecting member, the first connecting member is connected to the second connecting member by the plug-in portion and the coupling portion, and the locking member is connected to the plug-in portion and the coupling portion.

In the splicing assembly provided by the embodiment of the present disclosure, by fixing the first connecting member to the first display screen, fixing the second connecting member to the second display screen, and inserting the first connecting member to the second connecting member, the first connecting member is connected to the second connecting member by the plug-in portion and the coupling portion. Splicing accuracy can be ensured, so that the first display screen and the second display screen are reliably spliced together. The first display screen and the second display screen cannot be easily displaced. Workers do not need to repeatedly confirm the position, which effectively simplifies installation process of the splicing display screen and increases installation efficiency.

Optionally, in some embodiments of the present disclosure, the plug-in portion comprises at least two steps and the coupling portion comprises at least two mating steps. When the first connecting member is inserted into the second member, the first connecting member is engaged to the second connecting member by the steps and the mating steps.

In the splicing assembly provided by the embodiment of the present disclosure, by fixing the first connecting member to the first display screen, fixing the second connecting member to the second display screen, and inserting the first connecting member to the second connecting member, the first connecting member is connected to the second connecting member by the steps and the mating steps. Splicing accuracy can be ensured, so that the first display screen and the second display screen are reliably spliced together. The first display screen and the second display screen cannot be easily displaced. Workers do not need to repeatedly confirm the position, which effectively simplifies installation process of the splicing display screen and increases installation efficiency.

Optionally, in some embodiments of the present disclosure, a thickness of the steps is gradually decreasing in a direction from the first connecting member to the second connecting member, and a thickness of the mating steps is gradually increasing in a direction from the first connecting member to the second connecting member.

In the splicing assembly provided by the embodiment of the present disclosure, when the first connecting member is inserted into the second connecting member, the thickness of the steps is gradually decreasing in a direction from the first connecting member to the second connecting member and a thickness of the mating steps is gradually increasing in a direction from the first connecting member to the second connecting member. That is, the structure of the step and the mating step are complementary, which can make the structure of the first connecting member and the second connecting member more compact.

Optionally, in some embodiments of the present disclosure, the steps comprise a first step and a second step which is connected to a side of the first step, and a thickness of the first step is greater than a thickness of the second step, wherein the mating steps comprises a first mating step and a second mating step which is connected to a side of the first mating step, and a thickness of the first mating step is less than a thickness of the second mating step, and wherein when the first connecting member is inserted into the second connecting member, the first mating step is positioned on the side of the first step and is attached onto the second step, and the second mating step is positioned on the side of the second step.

In the splicing assembly provided by the embodiment of the present disclosure, when the first connecting member is inserted into the second connecting member, the first mating step is positioned on the side of the first step and is attached onto the second step, and the second mating step is positioned on the side of the second step. Therefore, the first connecting member is engaged to the second connecting member, which increases contact area of the first connecting member and the second connecting member, so that the first connecting member and the second connecting member can be firmly connected together and are not prone to shaking.

Optionally, in some embodiments of the present disclosure, a width of the first mating step is equal to a width of the second step.

In the splicing assembly provided by the embodiment of the present disclosure, when the first connecting member is inserted into the second connecting member, the first mating step exactly abut on the side surface of the first step. The side surface of the second mating step exactly abuts on the side surface of the second step. Therefore, the structure of the first connecting member and the second connecting member is compact and is beneficial to the reliability of the splicing assembly.

Optionally, in some embodiments of the present disclosure, the step further comprises a third step connected to a side of the second step away from the first step, and a thickness of the third step is less than the thickness of the second step,
  wherein the mating step further comprises a third mating step connected to a side of the second mating step away from the first mating step, the thickness of the third mating step is greater than the thickness of the second mating step, and
  wherein when the first connecting member is inserted into the second connecting member, the second mating step is attached onto the third step, and the third mating step is positioned on a side of the third step.

In the splicing assembly provided by the embodiment of the present disclosure, when the first connecting member is inserted into the second connecting member, the second mating step is attached onto the third step, and the third mating step is positioned on a side of the third step. Therefore, the first connecting member is engaged to the second connecting member, which increases contact area of the first connecting member and the second connecting member, so that the first connecting member and the second connecting member can be firmly connected together and are not prone to shaking.

Optionally, the thickness of the first step is equal to the thickness of the third mating step. Both the thickness of the first mating step and the thickness of the second step are equal to the thickness of the first step, and both the thickness of the second mating step and the thickness of the third step are equal to the thickness of the first step.

In the splicing assembly provided by the embodiment of the present disclosure, when the first connecting member is inserted into the second connecting member, a surface of the first mating step exactly abuts a surface of the second step, and a surface of the second mating step exactly abuts a surface of the third step. Therefore, the structure of the first connecting member and the second connecting member is compact and is beneficial to the reliability of the splicing assembly.

Optionally, a length of the first step, a length of the second step, a length of the third step, a length of the first mating step, a length of the second mating step, and a length of the third mating step are equal.

In the splicing assembly provided by the embodiment of the present disclosure, when the first connecting member is inserted into the second connecting member, the opposite sides of the surfaces of the first connecting member and the second connecting member are flushed with each other. Therefore, the structure of the first connecting member and the second connecting member is compact and is beneficial to the reliability of the splicing assembly.

Optionally, in some embodiments of the present disclosure, a width of the second mating step is equal to a width of the third step.

In the splicing assembly provided by the embodiment of the present disclosure, when the first connecting member is inserted into the second connecting member, the second mating step exactly abuts the side surface of the second step. The side surface of the third mating step exactly abuts the side surface of the third step. Therefore, the structure of the first connecting member and the second connecting member is compact and is beneficial to the reliability of the splicing assembly.

Optionally, in some embodiments of the present disclosure, the step is provided with a tenon, and the mating step is provided with a mortise corresponding to the tenon; and the tenon is inserted into the mortise when first connecting member is inserted into the second connecting member.

In the splicing assembly provided by the embodiment of the present disclosure, when the first connecting member is inserted into the second connecting member, the tenon is inserted into the mortise, so that the first connecting member and the second connecting member can be firmly connected together and are not prone to shaking.

Optionally, in some embodiments of the present disclosure, the tenon is provided on one side surface of the second step. The side surface of the second step, the tenon, and a surface of the third step enclose a notch. The mortise is provided on one side surface of the second mating step, and the second mating step is provided with an alignment base corresponding to the notch.

In the splicing assembly provided by the embodiment of the present disclosure, when the first connecting member is inserted into the second connecting member, the structure of the first connecting member and the second connecting member is compact and is beneficial to the reliability of the splicing assembly.

Optionally, a width of the tenon is equal to the width of the third step. An upper surface of the tenon away from the third step is flush with the surface of the second step.

In the splicing assembly provided by the embodiment of the present disclosure, the tenon has relatively strong mechanical strength, which can prevent the tenon from being squeezed and deformed, and effectively increase the reliability of the splicing assembly.

Optionally, in some embodiments of the present disclosure, the first connecting member is provided with a first pinhole, and the second connecting member is provided with a second pinhole; and the locking member is inserted into the first pinhole and the second pinhole when first connecting member is inserted into the second connecting member.

In the splicing assembly provided by the embodiment of the present disclosure, when the first connecting member is inserted into the second connecting member, the locking member is inserted into the first pinhole and the second pinhole, thereby preventing the first connecting member from detaching from the second connecting member.

Optionally, a thread of the locking member is screwed to the first pinhole and/or the second pinhole.

In the splicing assembly provided by the embodiment of the present disclosure, the locking member can be installed or disassembled by screwing the locking member, so that the first connecting member and the second connecting member can be separated which facilitates to disassemble and assemble the splicing display screens by workers.

Optionally, the locking member is fixed in the first pinhole and the second pinhole by glue.

In the splicing assembly provided by the embodiment of the present disclosure, when the first connecting member and the second connecting member need to be separated, a heat gun or other heating methods can be used for heating the glue within the first pinhole and the second pinhole so to pulled out the locking member. Therefore, the first connecting member and the second connecting member are separated.

Optionally, in some embodiments of the present disclosure, the plug-in portion comprises at least one plug-in board, and the coupling portion comprises at least one slot, and wherein the plug-in board is inserted into the corresponding slot when first connecting member is inserted into the second connecting member.

In the splicing assembly provided by the embodiment of the present disclosure, by fixing the first connecting member to the first display screen, fixing the second connecting member to the second display screen, and inserting the first connecting member to the second connecting member, the first connecting member is connected to the second connecting member by the plug-in board and the slot. Splicing accuracy can be ensured, so that the first display screen and the second display screen are reliably spliced together. The first display screen and the second display screen cannot be easily displaced. Workers do not need to repeatedly confirm the position, which effectively simplifies installation process of the splicing display screen and increases installation efficiency.

Optionally, in some embodiments of the present disclosure, the plug-in portion comprises at least one pillar, and the coupling portion comprises at least one cannula,
wherein the cannula sheathes outside the pillar when the first connecting member is inserted into the second connecting member.

In the splicing assembly provided by the embodiment of the present disclosure, by fixing the first connecting member to the first display screen, fixing the second connecting member to the second display screen, and inserting the first connecting member to the second connecting member, the first connecting member is connected to the second connecting member by the pillar and the cannula. Splicing accuracy can be ensured, so that the first display screen and the second display screen are reliably spliced together. The first display screen and the second display screen cannot be easily displaced. Workers do not need to repeatedly confirm the position, which effectively simplifies installation process of the splicing display screen and increases installation efficiency.

Optionally, in some embodiments of the present disclosure, the splicing assembly further comprises a sliding rail, and the first connecting member or the second connecting member is slidably connected to the sliding rail In the splicing assembly provided by the embodiment of the present disclosure, the sliding rail can define a movement track of the first connecting member or the second connecting member, so as to guide the insertion of the first connecting member and the second connecting member, and to increase assembly efficiency.

An embodiment of the present disclosure further provides a splicing display, comprising:
at least one first display screen,
at least one second display screen spliced with the corresponding first display screen, and
the splicing assembly described above, wherein the first connecting member is fixed to a back of the corresponding first display screen, and the second connecting member is fixed to a back of the corresponding second display screen.

In the splicing assembly provided by the embodiment of the present disclosure, the first display screen and the second display screen are spliced by the splicing assembly. Splicing accuracy can be ensured, so that the first display screen and the second display screen are reliably spliced together. The first display screen and the second display screen cannot be easily displaced. Workers do not need to repeatedly confirm the position, which effectively simplifies installation process of the splicing display screen and increases installation efficiency.

Optionally, in some embodiments of the present disclosure, the splicing assembly further comprises a sliding rail, the sliding rail is positioned on a back of the first display screen, and the first connecting member is slidably connected to the sliding rail along an insertion direction, or
the sliding rail is positioned on a back of the second display screen, and the second connecting member is slidably connected to the sliding rail along the insertion direction.

In the splicing assembly provided by the embodiment of the present disclosure, the sliding rail can define a movement track of the first connecting member or the second connecting member, so as to guide the insertion of the first connecting member and the second connecting member, and to increase assembly efficiency.

Beneficial Effects

The embodiment of the application employs a splicing assembly and a splicing display screen. Using the splicing assembly to splice the first display screen and the second display screen, the splicing accuracy can be ensured, so that the first display screen and the second display screen can be reliably spliced together. The first display screen and the second display screen cannot be easily displaced. Workers do not need to repeatedly confirm the position, which effectively simplifies installation process of the splicing display screen and increases installation efficiency.

DESCRIPTION OF DRAWINGS

In order to explain the technical solutions in the embodiments of the present disclosure more clearly, the following will briefly introduce the drawings required in the description of the embodiments. Obviously, the drawings in the following description are only some embodiments of the present disclosure. For people skilled in the art, without creative work, other drawings can be obtained based on the drawings.

DETAILED DESCRIPTION OF PREFERRED EMBODIMENTS

The technical solutions in the embodiments of the present disclosure will be clearly and completely described below combining with the accompanying drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work shall fall within the protection scope of the present disclosure. In addition, It is understandable that the specific embodiments described herein are only configured to illustrate and explain the present disclosure, and are not configured to limit the present disclosure. In the present disclosure, if there is no opposite explanation, the used orientation terms, such as "upper" and "lower" generally refer to the upper and lower directions of the device in actual use or working state, and specifically refer to the drawing directions in the drawings, while "inner" and "outer" refer to the contour of the device.

The embodiment of the present disclosure provides a splicing assembly and a splicing display screen. Detailed descriptions are given below. It should be noted that the order of description in the following embodiments is not meant to limit the preferred order of the embodiments.

Figure 1:
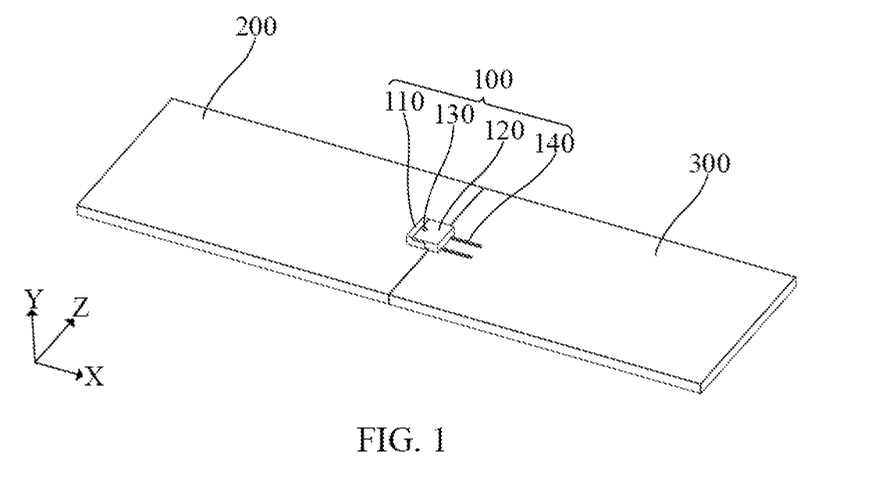
FIG. 1 is a schematic diagram of a three-dimensional structure of a first splicing display screen provided by an embodiment of the present disclosure.
Figure 2:
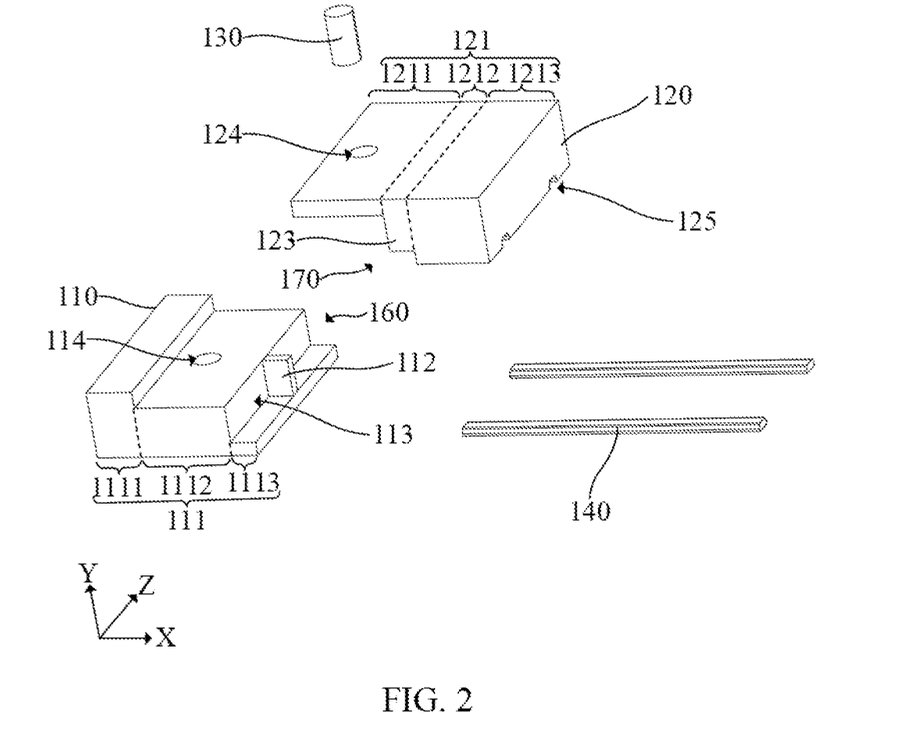
FIG. 2 is a schematic diagram of an exploded structure of the first splicing assembly provided by an embodiment of the present disclosure.

Please refer to FIG. 1 and FIG. 2. An embodiment of the present disclosure provides a splicing assembly 100, which is applied to a splicing display screen. Specifically, as shown in FIG. 1, the splicing display screen comprises a first display screen 200 and a second display screen 300. The splicing assembly 100 is used for positioning and splicing the first display screen 200 and the second display screen 300, which can ensure splicing accuracy, so that the first display screen 200 and the second display screen 300 are compactly spliced together and is beneficial to eliminate seams.

Specifically, as shown in FIG. 2, the splicing assembly 100 comprises a first connecting member 110 and a second connecting member 120. The first connecting member 110 has a plug-in portion 160. The second connecting member 120 is used for inserting into the first connecting member 110. The second connecting member 120 has a coupling portion 170 for mating with the plug-in portion 160. When the first connecting member 110 is inserted into the second connecting member 120, the first connecting member 110 is connected to the second connecting member 120 by the plug-in portion 160 and the coupling portion 170, so that the first display screen 200 and the second display screen 300 are positioned and spliced. Splicing accuracy is ensured so that the first display screen 200 and the second display screen 300 are compactly spliced together, which is beneficial to eliminate seams.

In the embodiment of the present disclosure, as shown in FIG. 1, the first connecting member 110 is fixed to the back of the first display screen 200. The second connecting member 120 is fixed to the back of the second display screen 300. During the splicing process, the first connecting member 110 is inserted into the second connecting member 120 so that the first display screen 200 and the second display screen 300 are spliced together. The first connecting member 110 and the second connecting member 120 can play the role of positioning and fixing connection. After the splicing process is completed, the first display screen 200 and the second display screen 300 cannot be easily displaced. Workers do not need to repeatedly confirm the position, which effectively simplifies installation process of the splicing display screen and increases installation efficiency.

Specifically, as shown in FIG. 1 and FIG. 2, the splicing assembly 100 further comprises a locking member 130, which is used for locking the first connecting member 110 and the second connecting member 120 together when the first connecting member 110 is inserted into the second connecting member 120. The locking member 130 connects to the plug-in portion 160 and the coupling portion 170 so that the first connecting member 110 and the second connecting member 120 can be reliably fixed together.

Specifically, as shown in FIG. 2, the plug-in portion 160 comprises at least two steps 111. The coupling portion 170 comprises at least two mating steps 121. When the first connecting member 110 is inserted into the second connecting member 120, the first connecting member 110 is engaged to the second connecting member 120 by the steps 111 and the mating steps 121, so that the first display screen 200 and the second display screen 300 are positioned and spliced. Splicing accuracy is ensured so that the first display screen 200 and the second display screen 300 are compactly spliced together, which is beneficial to eliminate seams.

For the convenience of description, an insertion direction of the first connecting member 110 and the second connecting member 120 is defined as a first direction X. When the first connecting member 110 is inserted into the second connecting member 120, an arrangement direction of the first mating step 1211 and the second step 1112 is defined as a second direction Y. The first direction X is perpendicular to the second direction Y. A direction perpendicular to both the first direction X and the second direction Y is a third direction Z. A distance along the first direction X is defined as a width. A distance along the second direction Y is defined as a thickness. A distance along the third direction Z is defined as a length.

Figure 3:
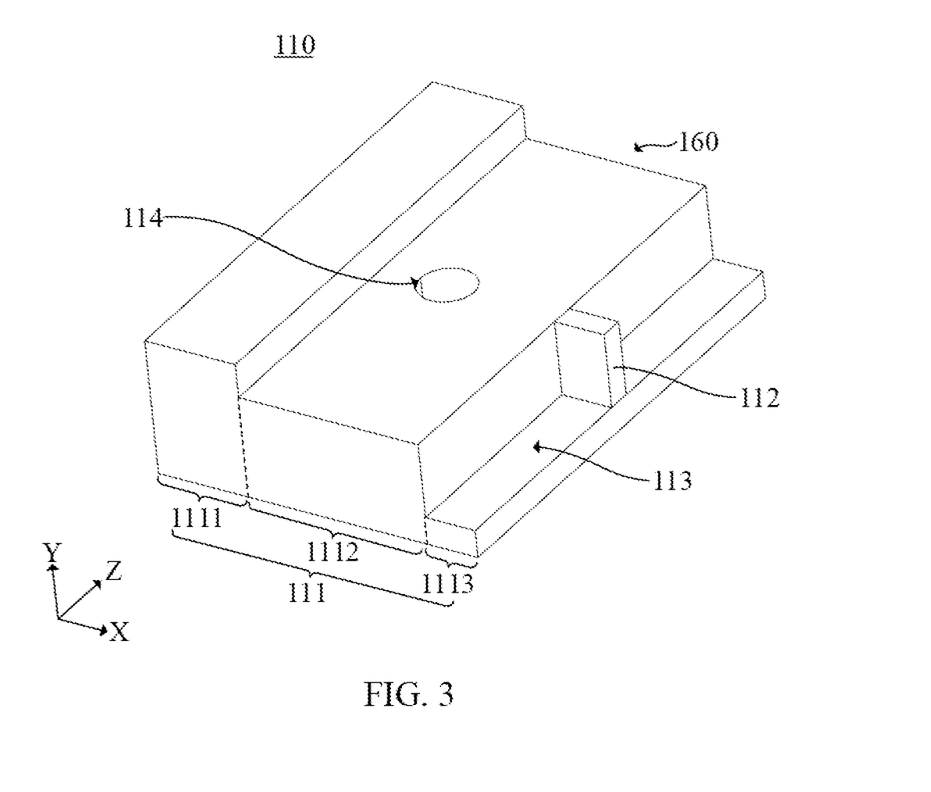
FIG. 3 is a schematic diagram of a three-dimensional structure of a first connecting member provided by an embodiment of the present disclosure.
Figure 4:
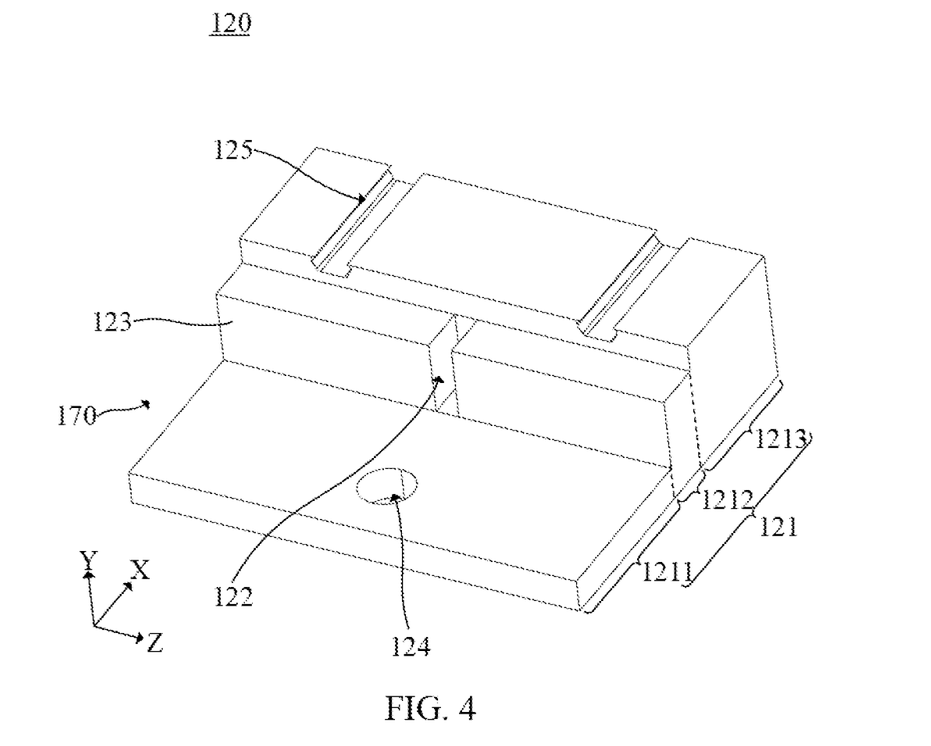
FIG. 4 is a schematic diagram of a three-dimensional structure of a second connecting member provided by an embodiment of the present disclosure.
Figure 5:
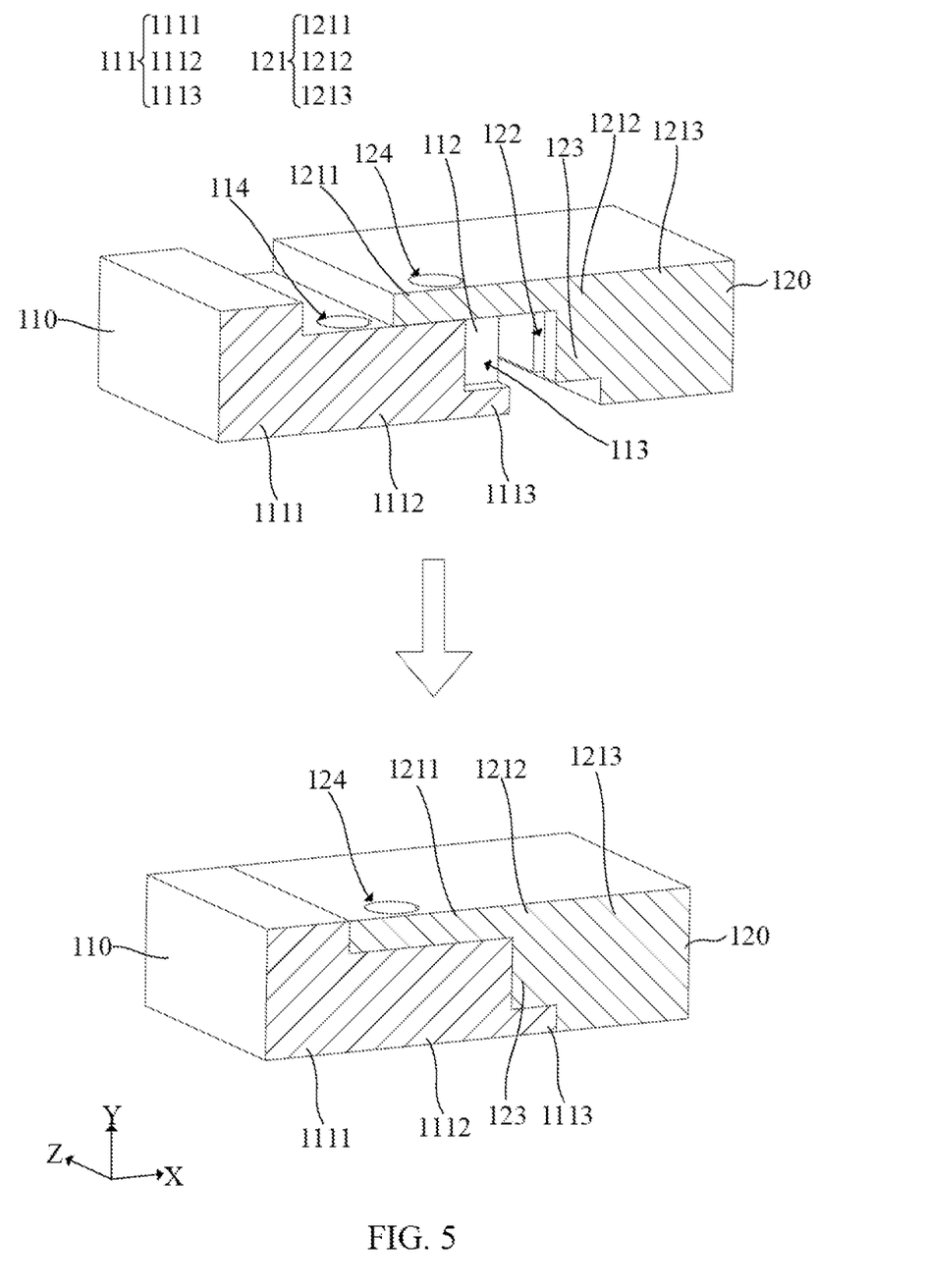
FIG. 5 is a schematic cross-sectional diagram of the first connecting member is inserted into the second connecting member provided by the embodiment of the present disclosure.

Specifically, as shown in FIGS. 3-5, a thickness of the steps 111 is gradually decreasing along a direction from the first connecting member 110 toward the second connecting member 120. A thickness of the mating steps 121 is gradually increasing along a direction from the first connecting member 110 toward the second connecting member 120.

When the first connecting member 110 is inserted into the second connecting member 120, because the structure of the step 111 and the mating step 121 are complementary, the structure of the first connecting member 110 and the second connecting member 120 is more compact.

Specifically, as shown in FIGS. 3-5, the first connecting member 110 may be provided with two steps 111, and correspondingly, the second connecting member 120 is also provided with two mating steps 121. In the present embodiment, the step 111 may comprise a first step 1111 and a second step 1112 which is connected to one side of the first step 1111. A thickness of the first step 1111 is greater than a thickness of the second step 1112. The mating steps 121 may comprise a first mating step 1211 and a second mating step 1212 which is connected to one side of the first mating step 1211. A thickness of the first mating step 1211 is smaller than a thickness of the second mating step 1212.

When the first connecting member 110 is inserted the second connecting member 120, the second steps 1112 is positioned on the side of the first steps 1111 close to the second connecting member 12. The second mating step 1212 is positioned at the side of the first mating step 1211 away from the first connecting member 110. The first mating steps 1211 is positioned on one side of the first step 1111 and attaches on the second step 1112. The second mating steps 1212 is positioned on one side of the second step 1112 so that the first connecting member 110 is engaged to the second connecting member 120. A contact area of the first connecting member 110 and the second connecting member 120 is increased, so that the first connecting member 110 and the second connecting member 120 can be firmly connected together and are not prone to shaking.

Specifically, the width of the first paired step 1211 is equal to the width of the second step 1112. In the present structure, when the first connecting member 110 and the second connecting member 120 are inserted, the first mating steps 1211 can exactly abut the side surface of the first step 1111. The side surface of the second mating steps 1212 can exactly abut the side surface of the second step 1112. Therefore, the structure of the first connecting member 110 and the second connecting member 120 are compact, which is beneficial to increase reliability of the splicing assembly 100.

Specifically, as shown in FIGS. 3-5, the first connecting member 110 may be provided with three steps 111, and correspondingly, the second connecting member 120 is also provided with three mating steps 121. In the present embodiment, the steps 111 further comprise a third step 1113 connected to the side of the second step 1112 away from the first step 1111. A thickness of the third step 1113 is smaller than a thickness of the second step 1112. The third mating step 1213 is connected to the side of the second mating step 1212 away from the first mating step 1211. A thickness of the third mating step 1213 is greater than the thickness of the second mating step 1212.

When the first connecting member 110 is inserted into the second connecting member 120, the third step 1113 is positioned on the side of the second step 1112 close to the second connecting member 120. The third mating step 1213 is positioned at the side of the second mating step 1212 away from the first connecting member 110. The second mating step 1212 attaches on the third step 1113. The third mating step 1213 is positioned on one side of the third step 1113, so that the first connecting member 110 is engaged to the second connecting member 120. The contact area of the first connecting member 110 and the second connecting member 120 is increased, so that the first connecting member 110 and the second connecting member 120 can be firmly connected together and is not prone to shaking.

Specifically, a width of the second mating step 1212 is equal to a width of the third step 1113. In the present structure, when the first connecting member 110 is inserted into the second connecting member 120, the second mating step 1212 exactly abuts the side surface of the second step 1112. The side surface of the third mating step 1213 exactly abuts the side surface of the third step 1113. The structure of the first connecting member 110 and the second connecting member 120 is compact, which is beneficial to increase the reliability of the splicing assembly 100.

Specifically, the thickness of the first step 1111 is equal to the thickness of the third pair of steps 1213. A sum of the thickness of both the first mating steps 1211 and the second step 1112 is equal to the thickness of the first step 1111. A sum of the thickness of both the second mating steps 1212 and the third step 1113 is equal to the thickness of the first step 1111. In the present structure, when the first connecting member 110 is inserted into the second connecting member 120, a surface of the first mating step 1211 can exactly abuts a side surface of the second step 1112. A side surface of the second mating step 1212 can exactly abut on a side surface of the third step 1113. Therefore, the structure of the first connecting member 110 and the second connecting member 120 is compact, which is beneficial to increase the reliability of the splicing assembly 100.

Specifically, a length of the first step 1111, a length of the second step 1112, a length of the third step 1113, a length of the first mating step 1211, a length of the second mating step 1212, and a length of the third mating step 1213 are equal. In the present structure, when the first connecting member 110 is inserted into the second connecting member 120, the opposite sides of the surfaces of the first connecting member 110 and the second connecting member 120 in the third direction Z are flat. Therefore, the structure of the first connecting member 110 and the second connecting member 120 is compact, which is beneficial to increase the reliability of the splicing assembly 100.

Specifically, as shown in FIGS. 3-5, the step 111 is provided with a tenon 112. The mating step 121 is provided with a mortise 122 corresponding to the tenon 112. A shape of the mortise 122 is shaped to fit the tenon 112. When the first connecting member 110 is inserted into the second connecting member 120, the tenon 112 is inserted into the mortise 122. In the present structure, the first connecting member 110 and the second connecting member 120 can be firmly connected together, and it is not prone to shaking. In the embodiment of the present disclosure, both the number of the tenon 112 and the number of mortise 122 are one. The number of tenon 112 and the number of mortise 122 can be adjusted appropriately according to actual selection and specific requirements, which is not uniquely limited herein.

Specifically, as shown in FIGS. 3-5, the tenon 112 is provided on the side surface of the second step 1112. The mortise 122 is provided on the side surface of one second mating step 1212. It is understandable that the specific positions of the tenon 112 and the mortise 122 can be adjusted appropriately according to the actual selection and specific requirements, as long as the tenon 112 can be sufficiently inserted into the mortises when the first connecting member 110 is inserted into the second connecting member 120, which is not uniquely limited herein.

Specifically, as shown in FIG. 3, the tenon 112 is connected to the third step 1113, which can increase a connection strength between the tenon 112 and the step 111, and prevent the tenon 112 from being deformed or broken. In the present structure, the side surface of the second step 1112, the tenon 112 and a surface of the third step 1113 enclose a notch 113. As shown in FIG. 4, the second mating step 1212 is provided with an alignment base 123 corresponding to the notch 113. Combining with FIG. 5, when the first connecting member 110 is inserted into the second connecting member 120, the alignment base 123 is inserted into the notch 113, so that the first connecting member 110 and the second connecting member 120 can be firmly connected together and are not prone to shaking.

In an embodiment of the present disclosure, the first connecting member 110 is provided with two notches 113. One of the notches 113 is provided on one side of the tenon 112, while another notch 113 is provided on another side of the tenon 112. The second connecting member 120 is provided with two alignment bases 123. One of the alignment bases 123 is positioned on one side of the mortise 122, while another alignment base 123 is positioned on another side of the mortise 122. It is understandable that the notch 113 is formed by the spaced tenons 112. The number of the notch 113 is determined by the number of the tenons 112. The number of the notch 113 is one more than the number of the tenon 112. Similarly, the alignment base 123 is formed by the spaced mortises 122. The number of the alignment base 123 is determined according to the number of the mortises 122, and the number of the counter blocks 123 is one more than the number of the mortises 122.

Specifically, as shown in FIG. 3, a width of the tenon 112 is equal to the width of the third step 1113. An upper surface of the tenon 112 away from the third step 1113 is flush with the surface of the second step 1112. In the present structure, the tenon 112 has relatively strong mechanical strength, which can prevent the tenon 112 from being squeezed and deformed, and effectively increase the reliability of the splicing assembly 100.

Specifically, as shown in FIG. 1 and FIG. 2, the first connecting member 110 is provided with a first pinhole 114. The second connecting member 120 is provided with a second pinhole 124. When the first connecting member is inserted into the second connecting member, the locking member 130 is inserted into the first pinhole 114 and the second pinhole 124, thereby preventing the first connecting member 110 and the second connecting member 120 from being separated.

In the embodiment of the present disclosure, the first pinhole 114 is positioned on the second step 1112. The second pinhole 124 is positioned on the first mating step 1211. The first pinhole 114 and the second pinhole 124 extend along the second direction Y. Certainly, the specific positions of the first pinhole 114 and the second pinhole 124 can be appropriately modified, which is not uniquely limited herein.

Optionally, at least one of the first pinhole 114 and the second pinhole 124 is provided with an internal thread. The locking member 130 is provided with an external thread. The locking member 130 is screwed to the first pinhole 114 and the second pinhole 124 by a matching thread of the external thread and the internal thread. Therefore, the locking member 130 is allow to be fixed in the first pinhole 114 and the second pinhole 124. In the present structure, the locking member 130 can be installed or disassembled by screwing the locking member 130, so that the first connecting member 110 and the second connecting member 120 can be separated which facilitates to disassemble and assemble the splicing display screens by workers.

Optionally, the locking member 130 may be fixed in the first pinhole 114 and the second pinhole 124 by glue. The glue may specifically be hot melt glue. After the first connecting member 110 is inserted into the second connecting member 120, the locking member 130 is fixed in the first pinhole 114 and the second pinhole 124 by glue to prevent the first connecting member 110 and the second connecting member 120 are separated. When the first connecting member 110 and the second connecting member 120 need to be separated, a heat gun or other heating methods can be used for heating the glue within the first pinhole 114 and the second pinhole 124 so to pulled out the locking member 130. Therefore, the first connecting member 110 and the second connecting member 120 are separated.

It is understandable that the locking member 130 can be fixed in the first pinhole 114 and the second pinhole 124 in other ways according to the selection of the actual situation and the specific requirements, which is not uniquely limited herein.

Specifically, as shown in FIGS. 1, 2, 6, and 7, the splicing assembly 100 further comprises a sliding rail 140. The first connecting member 110 or the second connecting member 120 is slidably connected to the sliding rail 140 along the insertion direction. In the present embodiment, the sliding rail 140 may define a movement track of the first connecting member 110 or the second connecting member 120 so as to guide the insertion of the first connecting member 110 to the second connecting member 120, which increases the assembling efficiency.

As shown in FIGS. 1 and 2, when the second connecting member 120 is slidably connected to the sliding rail 140, the first connecting member 110 can be directly fixed to the back of the first display screen 200 by glue, screws, or other means. The sliding rail 140 can be directly fixed to the back of the second display screen 300 by glue, screws, or other means. The sliding rail 140 extends along the insertion direction. The sliding rail 140 is provided with a second connecting member 120. When the first display screen 200 and the second display screen 300 is spliced, the second connecting member 120 can be pushed to slide on the sliding rail 140 so that the second connecting member 120 can be inserted into the first connecting member 110.

Figure 6:
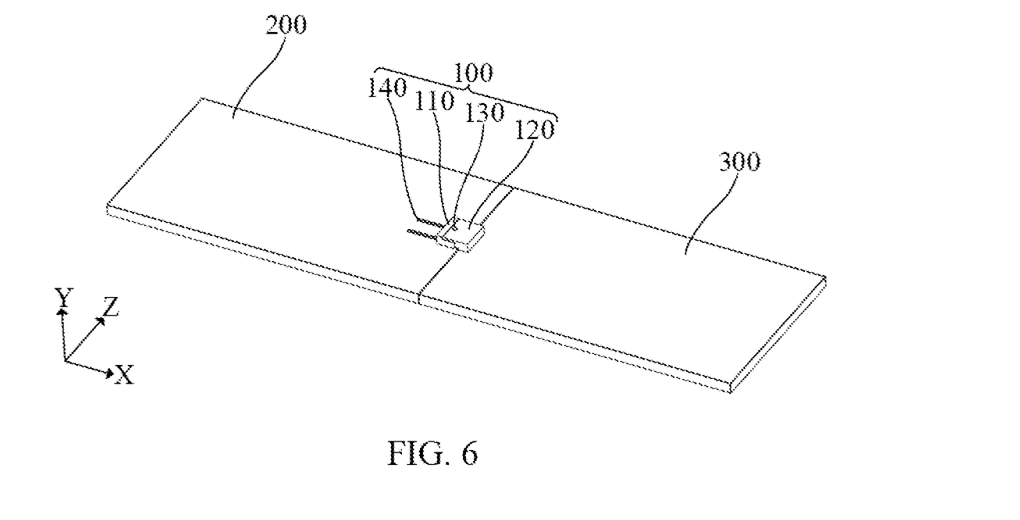
FIG. 6 is a schematic diagram of a three-dimensional structure of a second splicing display screen provided by an embodiment of the present disclosure.
Figure 7:
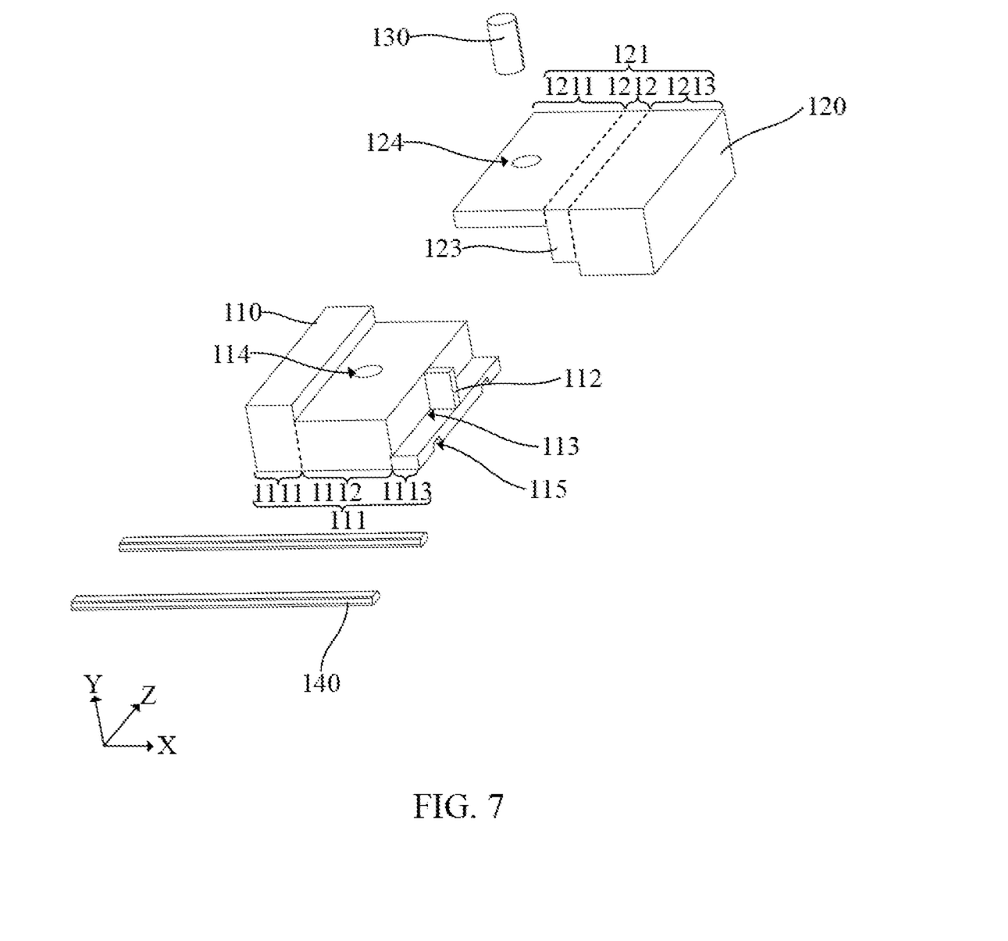
FIG. 7 is a schematic diagram of an exploded structure of a second type of splicing assembly provided by an embodiment of the present disclosure.

As shown in FIG. 6 and FIG. 7, when the first connecting member 110 is slidably connected to the sliding rail 140, the second connecting member 120 can be directly fixed to the back of the second display screen 300 by glue, screws, or other mean. The sliding rail 140 can be directly fixed on the back of the first display screen 200 by glue, screws, or other means. The sliding rail 140 extends along the insertion direction. The sliding rail 140 is provided with a first connecting member 110. When the first display screen 200 and the second display screen 300 are splicing, the first connecting member 110 can be pushed to slide on the sliding rail 140 so that the first connecting member 110 can be inserted into the second connecting member 120.

Specifically, as shown in FIG. 1 and FIG. 2, when the second connecting member 120 is slidably connected to the sliding rail 140, the second connecting member 120 is provided with a sliding groove 125. The sliding rail 140 is embedded in the sliding groove 125, so that the second connecting member 120 is slidably connected to the sliding rail 140. In the present embodiment, the sliding groove 125 is provided on the third mating step 1213.

Specifically, as shown in FIG. 6 and FIG. 7, when the first connecting member 110 is slidably connected to the sliding rail 140, the first connecting member 110 is provided with a sliding groove 115. The sliding rail 140 is embedded in the sliding groove 115, so that the first connecting member 110 is slidably connected to the sliding rail 140. In the present embodiment, the sliding groove 115 is positioned on the first step 1111, the second step 1112 and the third step 1113.

Figure 8:
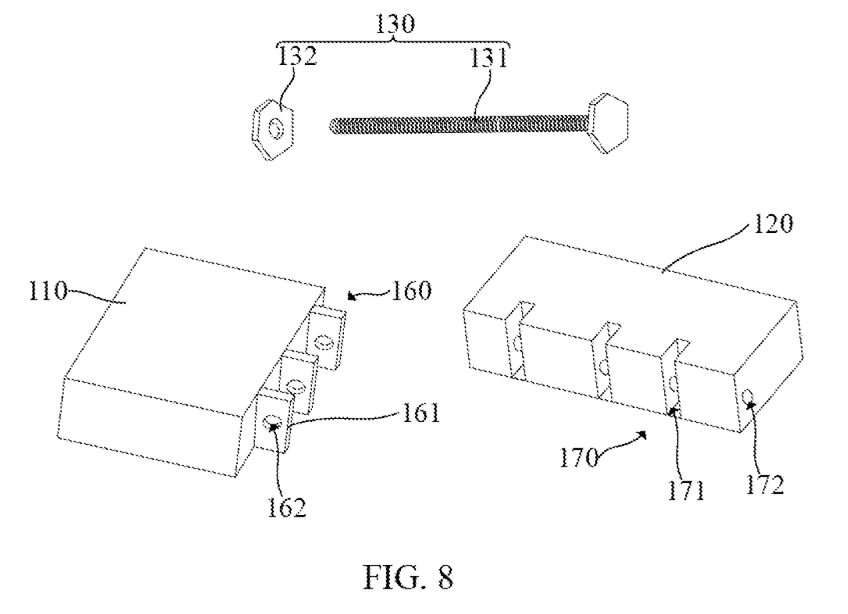
FIG. 8 is a schematic diagram of an exploded structure of a third type of splicing assembly provided by an embodiment of the present disclosure.

Specifically, as shown in FIG. 8, the plug-in portion 160 comprises at least one plug-in board 161. The coupling portion 170 comprises at least one slot 171. The plug-in board 161 and the slot 171 are in one-to-one correspondence. When the first connecting member 120 is inserted into the second connecting member 120, the plug-in board 161 is inserted into the corresponding slot 171. In the present embodiment, the plug-in plate 161 is provided with a first locking hole 162. The second connecting member 120 is also provided with a second locking hole 172 which communicates with the slot 171. The locking member 130 comprises a threaded connecting member 131 and a nut 132. The threaded connecting member 131 penetrates the first locking hole 162 and the second locking hole 172. The nut 132 screwed to the threaded connecting member 131. In the present structure, when the first connecting member 110 is inserted into the second connecting member 120, One end of the threaded connecting member 131 penetrates through the corresponding first locking hole 162 and the second locking hole 172, and then screwed to the nut 132, thereby locking the first connecting member 110 and the second connecting member 120 together.

Figure 9:
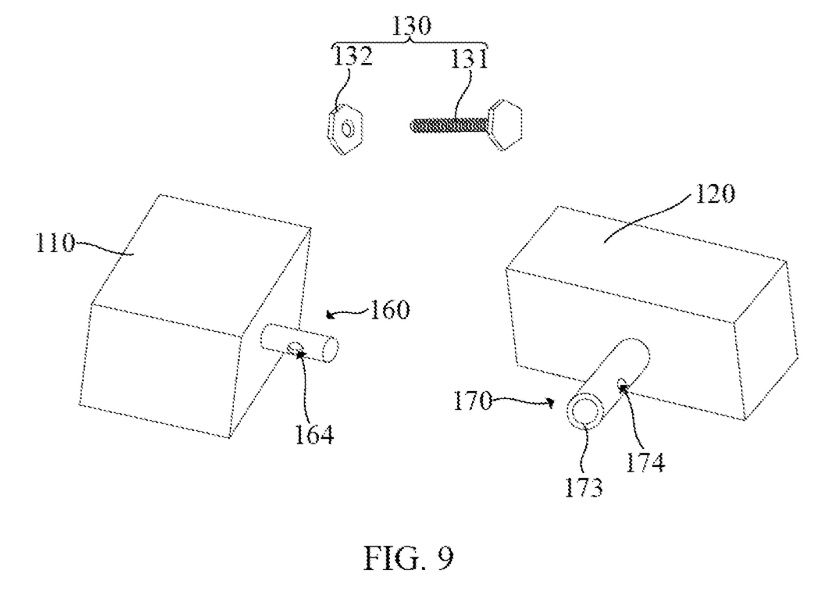
FIG. 9 is a schematic diagram of an exploded structure of a fourth type of splicing assembly provided by an embodiment of the present disclosure.

Specifically, as shown in FIG. 9, the plug-in portion 160 comprises at least one pillar 163. The coupling portion 170 comprises at least one cannula 173. The pillar 163 and the cannula 173 correspond to each other. When the first connecting member 120 is inserted into the second connecting member 120, the cannula 173 sheathes outside the pillar 163. The locking member 130 penetrates through the third locking hole 164 and the fourth locking hole 174. In the present embodiment, the pillar 163 is provided with a third locking hole 164. The cannula 173 is provided with a fourth locking hole 174 along a radial direction. The locking member 130 comprises a threaded connecting member 131 and a nut 132. The threaded connecting member 131 penetrates the third locking hole 162 and the forth locking hole 172. The nut 132 screwed to the threaded connecting member 131. In the present structure, when the first connecting member 110 is inserted into the second connecting member 120, one end of the threaded connecting member 131 penetrates through the corresponding third locking hole 164 and the fourth locking hole 174, and then screwed to the nut 132, thereby locking the first connecting member 110 and the second connecting member 120 together.

It is understandable that although FIG. 8 and FIG. 9 do not show the sliding rail, the embodiments shown in FIG. 8 and FIG. 9 may also comprise the sliding rail. The first connecting member 110 or the second connecting member 120 is slidingly connected to the sliding rail along the insertion direction. In the present embodiment, the sliding rail may define the movement track of the first connecting member or the second connecting member, so as to guide the insertion of the first connecting member and the second connecting member, and increase the assembling efficiency.

Please refer to FIG. 1 and FIG. 6, an embodiment of the present disclosure also provides a splicing display, comprising at least one first display screen 200, at least one second display screen 300, and the splicing assembly 100 as described above. The second display screen 300 and the corresponding first display screens 200 are spliced together. The first connecting member 110 is fixed to the back of the corresponding first display 200. The second connecting member 120 is fixed to the back of the corresponding second display 300. Because the splicing display of the present embodiment comprises the technical solutions of all the foregoing embodiments, it also has the beneficial effects of all the foregoing embodiments, and the beneficial effects of the splicing display are not repeated here.

Specifically, the splicing assembly 100 further comprises a sliding rail 140. The first connecting member 110 or the second connecting member 120 is slidably connected to the sliding rail 140 along the insertion direction. In the present embodiment, the sliding rail 140 may define the movement track of the first connecting member 110 or the second connecting member 120, so as to guide the first connecting member 110 to be inserted into the second connecting member 120 and to increase the assembling efficiency.

As shown in FIG. 1 and FIG. 2, when the second connecting member 120 is slidably connected to the sliding rail 140 in the insertion direction. The first connecting member 110 can be directly fixed to the back of the first display screen 200 by glue, screws, or other means. The sliding rail 140 can be directly fixed to the back of the second display screen 300 by glue, screws, or other means. The sliding rail 140 extends along the insertion direction. The sliding rail 140 is provided with a second connecting member 120. When the first display screen 200 is splicing with the second display screen 300, the second connecting member 120 can be pushed to slide on the sliding rail 140 so that the second connecting member 120 can be inserted into the first connecting member 110.

As shown in FIG. 6 and FIG. 7, when the first connecting member 110 is slidably connected to the sliding rail 140 in the insertion direction, the second connecting member 120 can be directly fixed to the back of the second display screen 300 by glue, screws, or other means. The sliding rail 140 can be directly fixed to the back of the first display screen 200 by glue, screws, or other means. The sliding rail 140 extends along the insertion direction. The sliding rail 140 is provided with a first connecting member 110. When the first display screen 200 is splicing with the second display screen 300, the first connecting member 110 can be pushed to slide on the sliding rail 140 so that the first connecting member 110 can be inserted into the second connecting member 120.

The splicing assembly and splicing display screen provided by the embodiments of the present disclosure are described above in detail. Specific examples are used herein to explain the principles and implementations of the present disclosure. The description of the above embodiments is only used for understanding the method of the present disclosure and its core ideas. Meanwhile, for people skilled in the art, according to the ideas of the present disclosure, there will be changes in the specific implementation and the scope of the present disclosure. In summary, the content of the present specification should not be understood as limitation of the present disclosure.

The invention claimed is:

1. A coupling assembly, comprising:
a first connecting member comprising a plug-in portion,
a second connecting member comprising a coupling portion for mating with the plug-in portion, and
a locking member for locking the first connecting member and the second connecting member together when the first connecting member is inserted into the second connecting member, and
wherein when the first connecting member is inserted into the second connecting member, the first connecting member is connected to the second connecting member by the plug-in portion and the coupling portion, and the locking member is connected to the plug-in portion and the coupling portion;

wherein the coupling assembly further comprises a sliding rail, and the first connecting member or the second connecting member is slidably connected to the sliding rail.

2. The coupling assembly of claim 1, wherein the plug-in portion comprises at least two steps and the coupling portion comprises at least two mating steps, when the first connecting member is inserted into the second member, the first connecting member is engaged to the second connecting member by the steps and the mating steps.

3. The coupling assembly of claim 2, wherein a thickness of the steps is gradually decreasing in a direction from the first connecting member to the second connecting member, and a thickness of the mating steps is gradually increasing in a direction from the first connecting member to the second connecting member.

4. The coupling assembly of claim 3, wherein the steps comprise a first step and a second step which is connected to a side of the first step, and a thickness of the first step is greater than a thickness of the second step,
wherein the mating steps comprise a first mating step and a second mating step which is connected to a side of the first mating step, and a thickness of the first mating step is less than a thickness of the second mating step, and
wherein when the first connecting member is inserted into the second connecting member, the first mating step is positioned on the side of the first step and is attached onto the second step, and the second mating step is positioned on the side of the second step.

5. The coupling assembly of claim 4, wherein a width of the first mating step is equal to a width of the second step.

6. The coupling assembly of claim 4, wherein the step further comprises a third step connected to a side of the second step away from the first step, and a thickness of the third step is less than the thickness of the second step,
wherein the mating step further comprises a third mating step connected to a side of the second mating step away from the first mating step, the thickness of the third mating step is greater than the thickness of the second mating step, and
wherein when the first connecting member is inserted into the second connecting member, the second mating step is attached onto the third step, and the third mating step is positioned on a side of the third step.

7. The coupling assembly of claim 6, wherein the thickness of the first step is equal to the thickness of the third mating step, both the thickness of the first mating step and the thickness of the second step are equal to the thickness of the first step, and both the thickness of the second mating step and the thickness of the third step are equal to the thickness of the first step.

8. The coupling assembly of claim 6, wherein a length of the first step, a length of the second step, a length of the third step, a length of the first mating step, a length of the second mating step, and a length of the third mating step are equal.

9. The coupling assembly of claim 6, wherein a width of the second mating step is equal to a width of the third step.

10. The coupling assembly of claim 6, wherein the step is provided with a tenon, and the mating step is provided with a mortise corresponding to the tenon, and the tenon is inserted into the mortise when first connecting member is inserted into the second connecting member.

11. The coupling assembly of claim 10, wherein the tenon is provided on one side surface of the second step, wherein the side surface of the second step, the tenon, and a surface of the third step enclose a notch, the mortise is provided on one side surface of the second mating step, and the second mating step is provided with an alignment base corresponding to the notch.

12. The coupling assembly of claim 10, wherein a width of the tenon is equal to the width of the third step, and an upper surface of the tenon away from the third step is flush with the surface of the second step.

13. The coupling assembly of claim 2, wherein the first connecting member is provided with a first pinhole, and the second connecting member is provided with a second pinhole, and the locking member is inserted into the first pinhole and the second pinhole when first connecting member is inserted into the second connecting member.

14. The coupling assembly of claim 13, wherein a thread of the locking member is screwed to the first pinhole and/or the second pinhole.

15. The coupling assembly of claim 13, wherein the locking member is fixed in the first pinhole and the second pinhole by glue.

16. The coupling assembly of claim 1, wherein the plug-in portion comprises at least one plug-in board, and the coupling portion comprises at least one slot, and wherein the plug-in board is inserted into the corresponding slot when first connecting member is inserted into the second connecting member.

17. The coupling assembly of claim 1, wherein the plug-in portion comprises at least one pillar, and the coupling portion comprises at least one cannula,
wherein the cannula sheathes outside the pillar when the first connecting member is inserted into the second connecting member.

18. A coupled display, comprising:
at least one first display screen,
at least one second display screen coupled with the corresponding first display screen, and
the coupling assembly of claim 1, wherein the first connecting member is fixed to a back of the corresponding first display screen, and the second connecting member is fixed to a back of the corresponding second display screen;
wherein the coupling assembly further comprises a sliding rail, the sliding rail is positioned on a back of the first display screen, and the first connecting member is slidably connected to the sliding rail along an insertion direction, or
the sliding rail is positioned on a back of the second display screen, and the second connecting member is slidably connected to the sliding rail along the insertion direction.

* * * * *